(12) United States Patent
Schillinger et al.

(10) Patent No.: US 9,622,372 B2
(45) Date of Patent: Apr. 11, 2017

(54) HOUSING-SIDE SEPARATING LAYER FOR THE STRESS DECOUPLING OF POTTED ELECTRONICS

(75) Inventors: Jakob Schillinger, Gaimersheim (DE); Dietmar Huber, Rödermark (DE); Dirk Theobald, Eschborn (DE)

(73) Assignee: Continental Teves AG & Co. oHG, Frankfurt (DE)

( * ) Notice: Subject to any disclaimer, the term of this patent is extended or adjusted under 35 U.S.C. 154(b) by 65 days.

(21) Appl. No.: 14/009,414

(22) PCT Filed: Apr. 4, 2012

(86) PCT No.: PCT/EP2012/056139
§ 371 (c)(1),
(2), (4) Date: Oct. 2, 2013

(87) PCT Pub. No.: WO2012/136692
PCT Pub. Date: Oct. 11, 2012

(65) Prior Publication Data
US 2014/0027172 A1    Jan. 30, 2014

(30) Foreign Application Priority Data

Apr. 7, 2011 (DE) .......... 10 2011 007 012
Nov. 9, 2011 (DE) .......... 10 2011 086 048

(51) Int. Cl.
*H05K 5/06* (2006.01)
*H05K 7/14* (2006.01)
*H05K 5/00* (2006.01)

(52) U.S. Cl.
CPC ............. *H05K 7/14* (2013.01); *H05K 5/0056* (2013.01); *H05K 5/064* (2013.01)

(58) Field of Classification Search
CPC .................. H05K 5/064; H01L 2924/181
USPC ............................................ 174/521
See application file for complete search history.

(56) References Cited

U.S. PATENT DOCUMENTS

| 4,731,644 | A | 3/1988 | Neidig |
| 6,583,355 | B2* | 6/2003 | Skrzypchak .......... 174/521 |
| 6,882,041 | B1 | 4/2005 | Cheah et al. |
| 7,728,440 | B2 | 6/2010 | Honda |
| 8,101,873 | B2* | 1/2012 | Bungo .......... H05K 3/284 174/521 |

(Continued)

FOREIGN PATENT DOCUMENTS

| DE | 0 113 073 A1 | 7/1984 |
| DE | 0 205 746 A1 | 12/1986 |

(Continued)

OTHER PUBLICATIONS

International Search Report for PCT/EP2012/056139 mailed Sep. 12, 2012.

(Continued)

*Primary Examiner* — Hung V Ngo
(74) *Attorney, Agent, or Firm* — RatnerPrestia

(57) ABSTRACT

The invention relates to a device, which includes a substrate for carrying an electrical circuit, a housing for enclosing the substrate, and a potting compound accommodated in the housing, which potting compound at least partially encloses the substrate. The potting compound can adhere to the housing. Furthermore, the device has a wall, from which the potting compound can detach.

4 Claims, 1 Drawing Sheet

(56) References Cited

U.S. PATENT DOCUMENTS

| | | | |
|---|---|---|---|
| 8,288,666 B2* | 10/2012 | Steinich | .................. 174/527 |
| 2001/0013640 A1 | 8/2001 | Tao | |
| 2006/0205237 A1* | 9/2006 | Kodama | ............. C09D 183/06 |
| | | | 438/790 |
| 2008/0170372 A1* | 7/2008 | Kirigaya | ................ H05K 5/065 |
| | | | 361/720 |
| 2009/0050957 A1 | 2/2009 | Nakao | |
| 2010/0079934 A1* | 4/2010 | Nakamura | ............. H05K 5/064 |
| | | | 361/679.01 |
| 2011/0053526 A1* | 3/2011 | Strei | ..................... H05K 5/064 |
| | | | 455/90.3 |
| 2012/0058314 A1* | 3/2012 | Mikami | ................. H04M 1/18 |
| | | | 428/195.1 |

FOREIGN PATENT DOCUMENTS

| | | |
|---|---|---|
| DE | 36 04 882 A1 | 8/1987 |
| DE | 0 398 108 A1 | 11/1990 |
| DE | 20 2007 003 687 U1 | 7/2008 |

OTHER PUBLICATIONS

German Search Report for DE 10 2011 086 048.7 mailed Oct. 23, 2012.

* cited by examiner

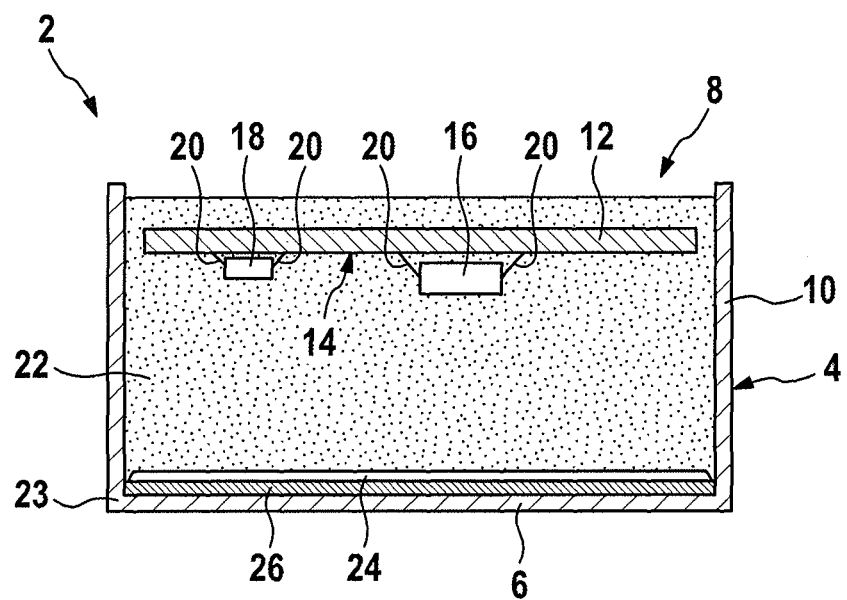

HOUSING-SIDE SEPARATING LAYER FOR THE STRESS DECOUPLING OF POTTED ELECTRONICS

CROSS REFERENCE TO RELATED APPLICATIONS

This application is the U.S. National Phase Application of PCT/EP2012/056139, filed Apr. 4, 2012, which claims benefit of German Patent Application Nos. 10 2011 007 012.5, filed Apr. 7, 2011 and 10 2011 086 048.7, filed Nov. 9, 2011, the contents of such applications being incorporated by reference herein.

FIELD OF THE INVENTION

The present invention relates to an apparatus comprising a substrate for supporting an electrical circuit, a housing for enclosing the substrate, and a potting compound which is accommodated in the housing and at least partially surrounds the substrate, and to a method for producing an apparatus of this kind.

BACKGROUND OF THE INVENTION

The potting compound protects the substrate in the housing against environmental influences. The potting compound could also mechanically fix the printed circuit board in the housing.

In this case, the substrate can be completely surrounded by the potting compound.

SUMMARY OF THE INVENTION

An aim of the invention is to improve the apparatus.

An aspect of the invention proposes forming a wall in the housing. In this case, the potting compound can adhere to the housing and detach itself from the wall.

An aspect of the invention assumes that the potting compound should adhere to the inner walls of the housing. When the potting compound cures, it being possible for this to occur due to polymerization when a plastic is used as the potting compound, the potting compound shrinks significantly depending on the material used. This shrinkage generates a tensile load on the substrate, and on the electronic components which are mounted on the substrate.

To this end, an aspect of the invention is based on the consideration that this tensile load, which acts on the electronic components, substantially leads to a tensile force due to the potting compound, said tensile force placing a mechanical load on the electrical contact-making points between the electrical components, such as solder points, adhesion points or wire-bonding points. The problem is exacerbated in the event of changing mechanical loads, as can occur on account of thermal-expansion processes of the potting compound in the event of fluctuations in temperature. Finally, the tensile load which acts on the electronic components may be responsible for cracks in the electrical contact-making points, these cracks leading to failure of the entire electrical circuit which is supported by the substrate.

An aspect of the invention is also based on the consideration that a strain-relief gap between the substrate and the potting compound could reduce this tensile load which acts on the electronic components. However, this strain-relief gap cannot prevent lateral movements between a surface of the substrate and the potting compound, with the result that the potting compound can still act on the electronic components and their electrical contact-making points with shear forces which can lead to the abovementioned failure of the entire circuit which is supported by the substrate.

In contrast, an aspect of the invention proposes allowing the strain-relief gap to be formed in the housing, rather than on the substrate. This provides a firm and durable connection between the potting compound and the substrate, with the result that lateral movements between the substrate and the potting compound are prevented.

An aspect of the invention therefore indicates an apparatus which comprises a printed circuit board for supporting an electrical circuit, a housing for enclosing the electrical printed circuit board, and a potting compound which is accommodated in the housing and at least partially surrounds the electrical printed circuit board. In this case, the potting compound can adhere to the housing. The housing also has a wall from which the potting compound can detach itself.

By virtue of inserting a wall in the housing, said wall differing from the rest of the housing and allowing the potting compound to be detached from the housing, a strain-relief gap can form between the housing and the substrate, with the result that mechanical loads which are transmitted from the potting compound to the substrate are reduced. Furthermore, the strain-relief gap in the housing has the further advantage that the impurities, such as moisture, which have diffused-in and collect in the strain-relief gap cannot cause any damage to the circuit due to migration and corrosion effects. This would be a probable cause of failure in the case of strain-relief gaps formed in the substrate.

In a development of the invention, one surface of the wall differs from a remaining surface of the housing. This difference can be created in any desired manner. For example, the housing and the wall can each be subjected to different surface treatments, this leading to the different indicated properties of the housing and the wall. As an alternative or in addition, the housing and the wall can be heated to different temperatures during processing, with the result that the potting compound continues to adhere to the housing whereas it detaches itself from the wall.

The surface of the wall and the remaining surfaces of the housing and/or the surface of the substrate are preferably formed such that the adhesion force between the potting compound and the surface of the wall is lower than the adhesion force between the potting compound and the remaining surface of the housing and/or the surface of the substrate, in particular wherein the adhesion force is in each case based on a defined reference area or an infinitesimal partial force.

In a particular development of the invention, the wall is a material which is inserted into the housing. The material can be chosen as desired. For example, the material used can be a liquid film, such as an oil film, which reduces the coefficient of friction of the housing in the region of the wall. As an alternative, the material used can be an impurity which has been introduced and which likewise leads to the potting compound becoming detached from the housing surface. The advantage of introducing a material into the housing as a wall is that a housing which is known per se can be produced in the known manner in first instance. This known housing can then be modified in the indicated manner, with the result that hardly any changes to a conventional production process are needed for the indicated apparatus.

In a preferred development of the invention, the material is fixed in the housing, with the result that the material cannot float away in some or other way when the housing is filled with the potting compound.

In an alternative or additional development, the material is in the form of a coating or film/foil which both can be introduced at firmly defined points in the housing in a technically simple manner.

In another development of the invention, the housing has a housing bottom side, a housing top side which is situated opposite the housing bottom side and comprises a housing opening, and a casing side which connects the housing bottom side and the housing top side, wherein the wall is formed on the housing bottom side. In other words, the strain-relief gap is formed at a point which is situated opposite the housing opening, with the result that the ingress of impurities into the strain-relief gap is minimized.

In a particular development of the invention, the substrate has a substrate top side and a substrate bottom side which is situated opposite the substrate top side and comprises the electrical circuit which is directed toward the housing bottom side in the housing. In other words, the strain-relief gap is arranged between the substrate top side and the housing bottom side. The potting compound therefore adheres to the housing casing which is formed laterally in relation to the substrate top side. In this way, the fixed connection between the potting compound and the housing casing further minimizes lateral movements between the substrate top side and the potting compound, as a result of which electronic components on the substrate and their electrical contact-making points are even more effectively protected against mechanical loading.

In another embodiment of the invention, the substrate has a substrate top side and a substrate bottom side which is situated opposite the substrate top side. In this case, the substrate top side and/or the substrate bottom side are plasma-treated. That is to say either a side of the substrate which is directed toward the housing bottom side or a side of the substrate which is directed toward the housing top side can be plasma-treated. A plasma is understood to be heated material which, in the gaseous state, is supplied with so much electrical energy that it is electrically conductive, even though it remains neutral to the outside. The surface of the substrate can be modified by the active particles contained in the plasma such that optimum adhesion to the potting compound is provided.

In a yet further embodiment of the invention, an inner side of the housing is plasma-treated. The surface on the inner side of the housing can be modified by the active particles contained in the plasma such that optimum adhesion to the potting compound is provided.

In a particular development, the surface in the interior of the housing and/or of the substrate is plasma-cleaned in the process. With the aid of the plasmas, it is possible, in this case, to free the surface in the interior of the housing and/or of the substrate even more effectively from an extremely wide variety of materials, for example carbon compounds. This improves the adhesion of the potting compound in the housing and/or to the substrate and improves the protection of the substrate against mechanical stresses which are caused by movements of the potting compound.

In a further particular development, the surface in the interior of the housing and/or of the substrate is plasma-activated. In this case, activation is understood to mean an increase in the surface energy and/or surface tension. This increased surface energy further increases the adhesion of the potting compound to the surface in the interior of the housing and/or of the substrate.

The invention also indicates a method for producing an apparatus having a substrate for supporting an electrical circuit and having a housing, which has a housing bottom side and a housing top side which is situated opposite the housing bottom side and comprises a housing opening, for enclosing the substrate, that comprises the steps of applying a material to the housing bottom side and pouring a potting compound into the housing. In this case, the potting compound can adhere to the housing and detach itself from the material.

Developments of the method can be method steps which correspondingly realize the features of the indicated apparatus in line with the dependent claims.

BRIEF DESCRIPTION OF THE DRAWINGS

The above-described properties, features and advantages of this invention and the manner in which these are achieved will be understood more clearly and explicitly in connection with the following description of the exemplary embodiments which will be explained in greater detail in connection with the drawings, in which:

FIG. 1 shows a schematic illustration of an exemplary apparatus according to the invention.

DETAILED DESCRIPTION OF THE INVENTION

Reference is made to FIG. 1 which shows a schematic illustration of an exemplary apparatus 2 according to the invention.

The apparatus 2 has a housing 4 which a housing base 6, a housing opening 8 which is situated opposite the housing base 6, and a housing casing 10 which connects the housing base 6 and the housing opening 8.

A substrate 12, which supports an electrical circuit 14 on its side which is directed toward the housing base 6, is enclosed in the housing 4. A first electronic component 16 and a second electronic component 18, which each comprise two electrical contacts 20 to conductor tracks (not shown) of the electronics circuit 14, of the circuit 14 are indicated in FIG. 1. In this case, the substrate 12 can be a printed circuit board which is composed of a thermoplastic, duroplastic or polyimide, or can be a ceramic support.

The electrical circuit 14 is surrounded by a potting compound 22 in the housing 4. The potting compound adheres to the wall 23 of the housing which is formed by the housing base 6 and the housing casing 10. A strain-relief gap 24 is present on the housing base 6 between the potting compound 22 and the housing base 6, said strain-relief gap being formed by a material 26 to which the potting compound 22 cannot adhere and which is applied to the wall 23 at the housing base 6 during production of the illustrated apparatus 2. The material 26 can be fastened to the housing base 6 as an anti-adhesion layer, for example in the form of Teflon, or as a non-adhesive layer, for example in the form of silicone.

In order to produce the apparatus 2, the material 26 is first applied to the housing base 6 and the substrate 12 is then arranged in the housing 4 in the shown manner. Finally, the potting compound 22 is poured into the housing 4. The potting compound 22 can be, for example, a plastic, such as polyurethane, the housing 4 being filled with said potting compound and said potting compound polymerizing in the housing 4.

The invention claimed is:

1. A method for producing an apparatus having a substrate for supporting an electrical circuit and having a housing, the housing having a housing top side and interior walls including a housing interior bottom side, the housing top side being situated opposite the housing interior bottom side and comprising a housing opening for enclosing the substrate, the method comprising:
  plasma treating the interior walls of the housing with a plasma activation without plasma treating the housing interior bottom side, and
  pouring the potting compound into the housing and onto the interior walls and the housing interior bottom side, wherein the potting compound can adhere to the plasma treated interior walls of the housing without adhering to the housing interior bottom side that is not plasma treated.

2. The method of claim 1, further comprising plasma treating top and bottom surfaces of the substrate with the plasma activation.

3. The method of claim 2, wherein the plasma treating steps comprise supplying heated material in a gaseous state that is electrically conductive.

4. The method of claim 1, further comprising plasma treating a surface of the substrate that faces the housing bottom side with the plasma activation.

* * * * *